United States Patent [19]
Cohen

[11] Patent Number: 5,394,117
[45] Date of Patent: Feb. 28, 1995

[54] DIRECT DIGITAL SYNTHESIZER-BASED INJECTION LOCKED OSCILLATOR

[75] Inventor: Leonard D. Cohen, Brooklyn, N.Y.
[73] Assignee: AIL Systems, Inc., Deer Park, N.Y.
[21] Appl. No.: 69,556
[22] Filed: May 28, 1993
[51] Int. Cl.$^6$ ........................................ H03B 28/00
[52] U.S. Cl. ........................................ 331/47; 331/55; 331/172; 331/177 R
[58] Field of Search ............ 331/49, 56, 172, 47, 331/55, 20, 87, 145, 149, 153, 177 R

[56] References Cited

U.S. PATENT DOCUMENTS

| | | | |
|---|---|---|---|
| 3,304,518 | 2/1967 | Mackey | 331/172 X |
| 3,626,315 | 12/1971 | Stirling et al. | 331/172 X |
| 4,097,823 | 6/1978 | Jerinic et al. | 331/55 X |
| 4,453,138 | 6/1984 | Scheer | 331/47 |
| 4,965,533 | 10/1990 | Gilmore | 331/18 |

OTHER PUBLICATIONS

Edwards, G., "GaAs NCO Operates up to 1.4 GHz", RF Design, Jun. 1990, pp. 42–51.
Zhang, X. et al., "A Study of Subharomonic Injection Locking for Local Oscillators", IEEE Trans. Microwave and Guided Wave Letters, vol. 2, No. 3, Mar. 1992, pp. 97–99.
Ottman, H. & Nonnemaker, C., "Subharmonically Injection Phase Locked Gunn Oscillator Experiments", IEEE Trans. MTT, Sep. 1969, pp. 728–729.
Chien, C. & Dalman, G., "Subharmonically Injection Phase Locked Impatt Oscillator Experiments", Electronic Letters, Apr. 16, 1990, vol. 6, No. 8, pp. 240–241.
Paciorek, L. J., "Injection Locking of Oscillators", Proc. IEEE, vol. 53, No. 11, Nov. 1965, pp. 1723–1727.
Stanford Telecom Co., Santa Clara, Calif., Application Note AN102; Zarrel, R. J. Jr., Mar. 1990; pp. 122–124.
Lauria, V., "Direct Digital Synthesizers in Modern Electronic Warfare Systems", Topic in Engineering, vol. III, 1992, pp. 2–49 to 2–64, AIL Systems, Inc.
Hughes Aircraft Co., Jan. 1991, Catalog #90801, p. 41.
Cohen, L. D. and Breuer, K., "A Fast Tuned, Injection Locked, DDS Based Local Oscillator for the 3.6 to 4.1 GHz Frequency Range", 1993 IEEE MTT-s International Microwave Synposium Digest, Jun. 1993, pp TBD.

Primary Examiner—David Mis
Attorney, Agent, or Firm—Hoffmann & Baron

[57] ABSTRACT

A direct digitally synthesizer-based, injection locked oscillator includes a direct digital synthesizer for generating a digitally synthesized signal at frequency $f_0$, an analog oscillator circuit for generating an analog signal at frequency $f_1$ and a filter coupled to the direct digital synthesizer for filtering the digitally synthesized signal to provide a signal at frequency $Nf_0$. N may be an integer from 1 to 10. Also included is a coupler to couple the filtered, digitally synthesized signal into the analog oscillator to lock the frequency of the analog output signal to the frequency of the digitally synthesized signal such that the frequency $f_1$ is equal to the frequency $Nf_0$. The coupler also electrically couples the analog signal from the analog oscillator circuit to a second filter to filter the analog signal. An amplifier electrically coupled to the second filter amplifies the filtered signal to provide an analog oscillator output signal. The direct digital synthesizer may be used to high-order, sub-harmonically injection lock the analog oscillator circuit thereby providing an output signal reflecting a frequency up-conversion in order to broaden the frequency range of the synthesized analog output signal beyond that of the direct digital synthesizer.

22 Claims, 12 Drawing Sheets

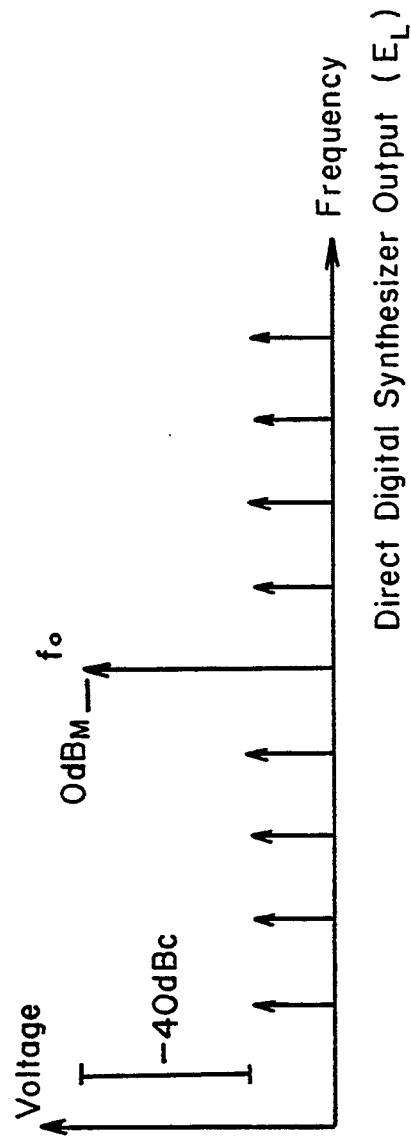
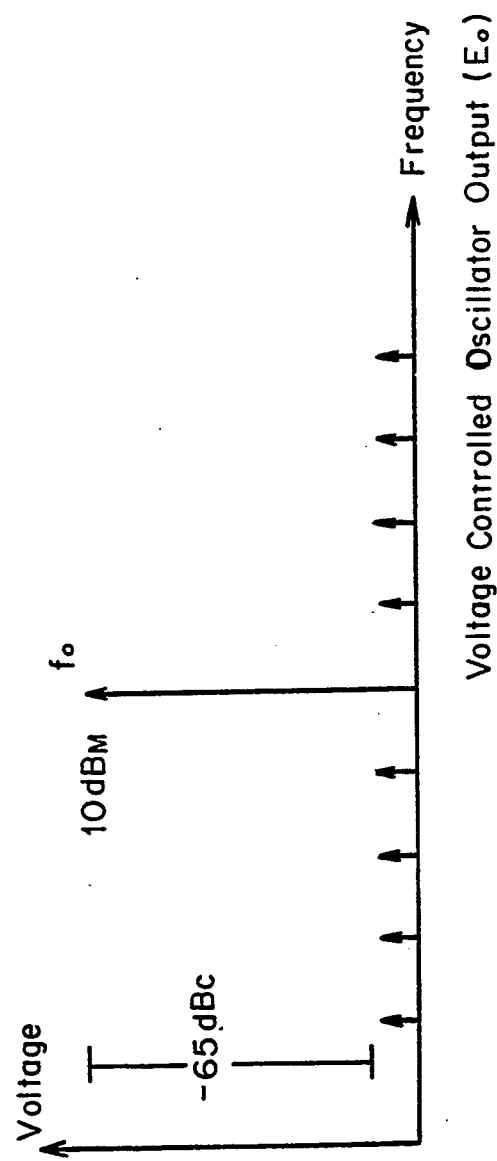

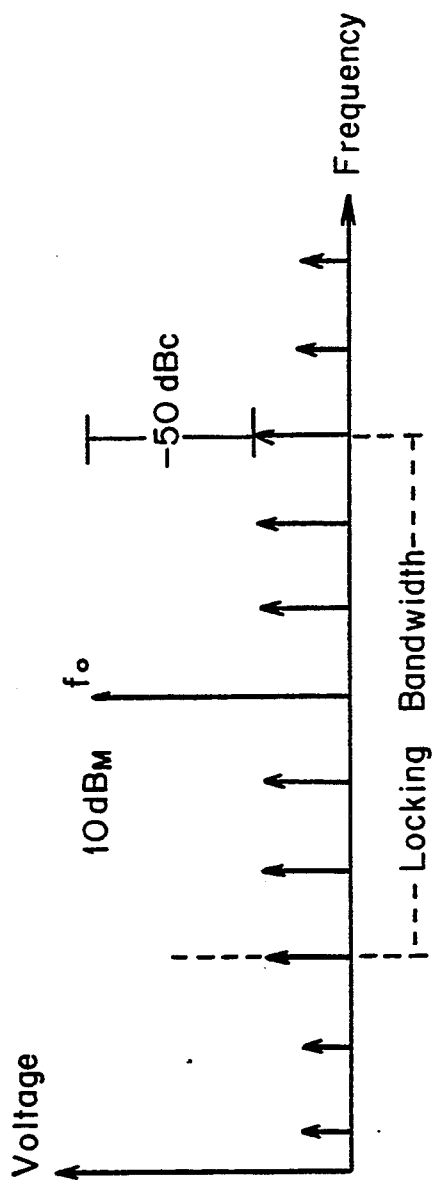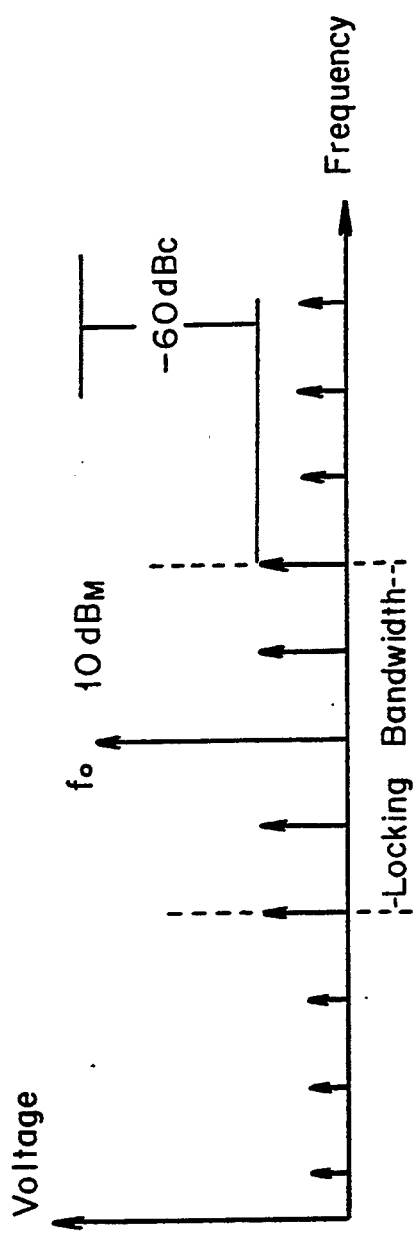

DIRECT DIGITAL SYNTHESIZER-BASED INJECTION LOCKED OSCILLATOR

BACKGROUND OF THE INVENTION

1. Field of the Invention

The invention relates to frequency synthesized oscillators, and more particularly relates to injection locked, synthesized oscillators.

2. Description of the Prior Art

Frequency synthesizers or synthesized oscillators are combinations of circuits and devices which synthesize signals for output at various frequencies. Synthesizers are common to both receiving and transmitting circuits, where they serve as carrier oscillators and local oscillators for mixers. Synthesizer frequencies may be fixed or tunable, either continuously or in steps. Spectral purity and frequency stability are critical design criteria for any frequency synthesizer or synthesized oscillator.

There are three basic types of frequency synthesizers in use today. These include the direct analog synthesizer, the indirect analog synthesizer which utilize phase locked loops, and the direct digital synthesizer.

Direct analog synthesizers utilize multiple RF techniques to translate and multiply reference frequencies to a desired frequency range. Frequency resolution using such methods, however, is generally poor, requiring many combinations of mixers and dividers to make small improvements in resolution.

Indirect synthesizers (phase locked loops) use analog voltage controlled oscillators as the primary frequency generating device. By comparing the output phase/frequency of the voltage controlled oscillator with a stable reference, i.e., a crystal oscillator, an error signal is produced to precisely control the output frequency. The spectral purity of output signals generated by a phase locked loop is generally very high, because the loop acts as a narrow tracking filter suppressing large amounts of noise inside the loop bandwidth. The narrow loop bandwidth, however, limits synthesizer tuning speed, which is a major limitation.

Direct digital synthesizer technology offers the simplest architecture of the three approaches, utilizing high speed digital circuitry to numerically generate a frequency stable sinewave pattern. Direct digital synthesizers may be used to quickly generate sinusoidal signals to a fraction of a hertz, the generated signals displaying low phase noise. Direct digital synthesizers may also be used to implement varied linear sweep and chirp signal generation. The sweep rate and linearity of the output is primarily a function of the quality of the system clock source.

FIG. 1 shows a direct digital synthesizer 1 comprising three basic elements: a phase accumulator 2, a sine look up ROM 4 and a digital-to-analog (D/A) converter 6. Direct digital synthesizer 1 digitally integrates incremental phase changes at a higher clock frequency than the frequency of the desired sinusoidal signal within phase accumulator 2. The synthesizer 1 then converts the resulting phase information to sinusoidal amplitude with sine look up ROM 4 and converts the digitized sinewave to an analog voltage with a D/A converter 6 (see FIG. 1A).

Current direct digital synthesizer technology is limited by upper clock frequency bounds of about 1 GHz. As a result, maximum direct digital synthesizer output frequency signals presently span approximately 240 MHz. To operate at higher frequencies, mixer conversions and multiplication may be used to increase the output bandwidth. Multiplication, however, affects discrete spurious tones, i.e., spurious signals. For example, multiplication by a factor of N increases the power level of spurious signal components by $N^2$, lowering the spectral purity of the output signal.

Spurious frequency components or spurs are often found "close-in" to a carrier signal. Even a perfect D/A converter used within a direct digital synthesizer will produce spurious frequency components. This is because each discrete amplitude sample of the fabricated waveform is a quantized approximation of the ideal value. Consequently, digital-to-analog converter errors are unavoidable, showing themselves as harmonics, intermodulation products, and spurious signals, very close in frequency to the desired signal.

OBJECTS AND SUMMARY OF THE INVENTION

It is therefore an object of the present invention to provide a synthesized oscillator which utilizes a signal generated by a direct digital synthesizer to synthesize an analog output such that the fine frequency resolution, fast frequency tuning and low phase noise characteristic of direct digital synthesizer technology are manifested in the synthesized analog output.

It is another object of the present invention to provide a synthesized oscillator which utilizes a signal generated by a direct digital synthesizer to synthesize an analog output in a time within the nanosecond range thereby complementing the nanosecond switching speed of the direct digital synthesizer.

It is still another object of the present invention to provide a method of fast tuning an analog oscillator by injection locking the analog oscillator with a signal generated by a direct digital synthesizer.

It is yet another object of the present invention to provide a synthesized oscillator utilizing a signal generated by a direct digital synthesizer at a subharmonic frequency of an analog oscillator in order to provide an analog output with an up-converted and broadened frequency range as compared to the direct digital synthesizer.

It is a further object of the present invention to provide a synthesized oscillator utilizing a fourth harmonic of a signal generated within a direct digital synthesizer to injection lock an analog oscillator resulting in a frequency up-conversion at a fivefold increase in locking bandwidth relative to conventional injection locking methods.

It is still a further object of the present invention to provide a synthesized oscillator capable of suppressing spurious AM and FM frequency components inherent within a signal generated by a direct digital synthesizer source such that the spectral purity of an analog signal synthesized using the digitally synthesized signal is displayed over an expanded spurious component free dynamic range.

The present invention, which addresses the needs of the prior art, provides a method of fast tuning an analog oscillator to generate a frequency up-converted analog output signal substantially free from spectral impurities. The method includes tuning an analog oscillator circuit to generate an analog signal at a frequency $f_1$, tuning a direct digital synthesizer to generate a digitally synthesized signal at frequency $f_0$ and amplifying the digitally synthesized signal so that the amplified signal contains harmonics at frequencies $Kf_0$, where K is an integer preferably from about 1 to about 10.

The method also includes filtering the amplified, digitally synthesized signal to remove substantially all frequency components other than $Nf_0$, where N is an integer within the K integer range and $Nf_0$ is within a locking bandwidth of the analog oscillator. The digitally synthesized filtered signal is then injected into the analog oscillator circuit to lock the frequency $f_1$ of the analog signal at frequency $Nf_0$ ($f_1 = Nf_0$). The method may further include filtering the analog signal (at frequency $f_1$) to remove substantially all frequency components and harmonics other than $Lf_1$, where L is an integer preferably from about 1 to about 10, and amplifying the filtered analog signal to a level sufficient to drive a load.

The present invention also provides a fast tuned, injection locked, synthesized oscillator for generating an analog output signal free from spectral impurities which includes an analog oscillator circuit for generating an analog signal at a frequency $f_1$, a direct digital synthesizer for generating a digitally synthesized signal at a frequency $f_0$ within a locking bandwidth of the analog oscillator circuit and a coupler for coupling the digitally synthesized signal into the analog oscillator circuit so that the frequency $f_1$ of the analog signal is locked to the frequency $f_0$ of the digitally synthesized signal so that $f_1 = f_0$.

The synthesized oscillator also includes a filter electrically coupled to the coupler for receiving and bandpass filtering the analog signal, and an amplifier electrically coupled to the filter for amplifying the filtered signal. The filter may also include means for removing substantially all frequency components of the analog output signal other than one harmonic so that a resulting signal is output at frequency $Nf_1$, where N is an integer preferably within a range of from about 1 to about 10.

In another form of the invention, a fast tuned, injection locked, synthesized oscillator includes an analog oscillator circuit to generate an analog signal at frequency $f_1$ and a direct digital synthesizer to generate a digitally synthesized signal at frequency $f_0$. A first filter is electrically coupled to the direct digital synthesizer to filter the digitally synthesized signal such that its frequency is $Nf_0$. A coupler couples the filtered, digitally synthesized signal at frequency $Nf_0$ into the analog oscillator circuit to lock the frequency $f_1$ of the analog signal at the frequency of the digitally synthesized signal so that $f_1$ equals $Nf_0$. Isolating means electrically coupled to the coupler receives the analog signal and isolates the coupler from the analog oscillator circuit. A second filter electrically coupled to the isolating means filters the analog signal, and an amplifier electrically coupled to the second filter amplifies the filtered analog signal to a level sufficient to drive a load.

The first filter may remove substantially all frequency components of the digitally synthesized signal other than one harmonic, the frequency of which is within a locking bandwidth of the analog oscillator circuit. The second filter may include means to remove substantially all frequency components of the analog signal other than one harmonic such that a resulting signal is output at frequency $Mf_1$, where M is an integer within a range of from about 1 to about 10.

These and other objects, features and advantages of the invention will become apparent from the following detailed description of illustrative embodiments thereof, which is to be read in conjunction with the accompanying drawings.

BRIEF DESCRIPTION OF THE DRAWINGS

FIG. 5A is a spectral analysis plot of amplitude versus frequency showing the spectral content of a signal generated by a direct digital synthesizer used within the present invention.

FIG. 5B is a spectral analysis plot of amplitude versus frequency showing the spectral content of a signal generated by a voltage controlled oscillator used within the present invention.

FIG. 5C is a spectral analysis plot of amplitude versus frequency showing an output of a synthesized oscillator of the present invention within which a signal generated by a voltage controlled oscillator is locked by a digitally synthesized signal.

FIG. 5D is a spectral analysis plot of amplitude versus frequency showing an output of a synthesized oscillator of the present invention within which a signal generated by a voltage controlled oscillator is locked by a digitally synthesized signal 10 dB down in power from the locking signal shown in FIG. 5C.

DETAILED DESCRIPTION OF THE PREFERRED EMBODIMENTS

In accordance with the present invention, it has been found that spurious frequency components inherent in signals generated within a direct digital synthesizer may be avoided in a synthesized oscillator output signal if the digital signal is used merely to injection lock an analog signal source. The injection locking technique of the present invention provides for the use of digitally synthesized signals at fundamental and subharmonic frequencies of the analog signal source to lock the analog source.

Injection locking is explained as follows. The frequency of an analog oscillator may be locked to the frequency of an external signal injected into the analog oscillator circuit. The frequency of the external signal, however, must be within the normal operating frequency range of the analog oscillator circuit (locking bandwidth). The time required for locking is referred to as the locking time.

Figure 1:
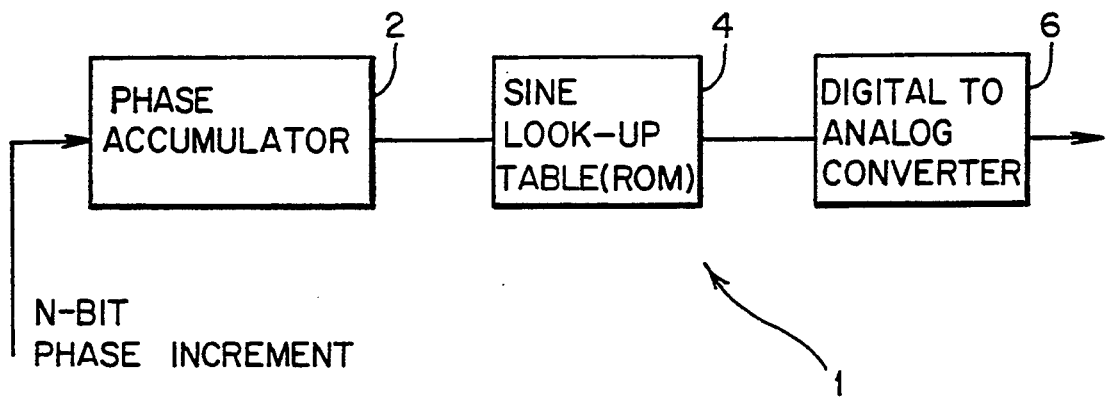
FIG. 1 is a block diagram showing the primary components of a direct digital synthesizer.
Figure 1A:
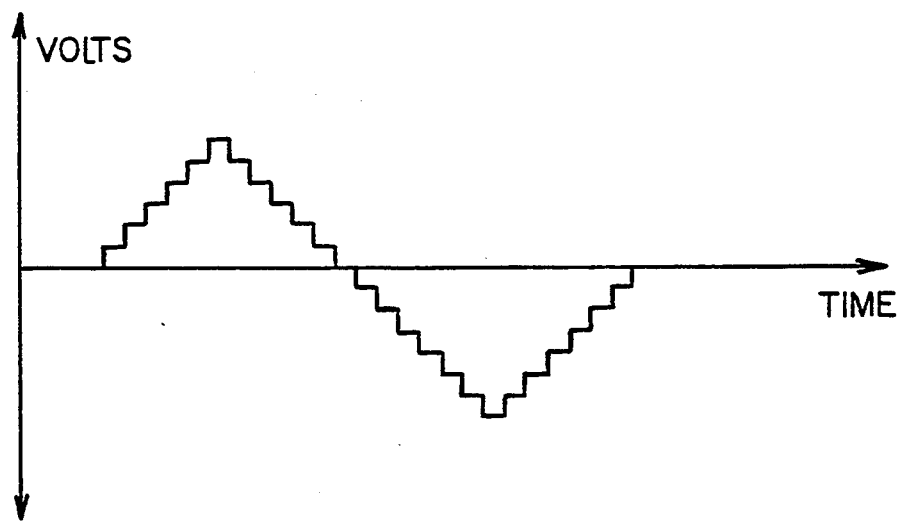
FIG. 1A is a graph of amplitude versus time and shows a sinewave signal formed at the output of a digital-to-analog converter within a direct digital synthesizer.
Figure 2:
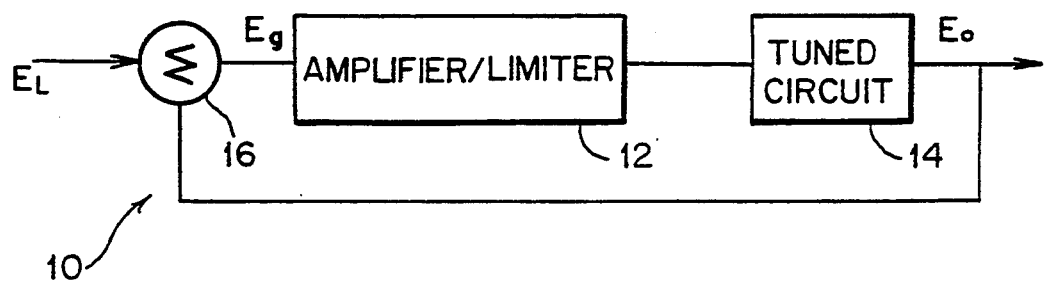
FIG. 2 is a block diagram showing an injection locking circuit of the prior art.

FIG. 2 shows a block diagram of a model of an injection locked oscillator 10. For a more detailed explanation of injection locking, reference is made to the article "Injection Locking of Oscillators," by L. J. Paciorik, IEEE Proceedings, Vol. 53, No. 11, November 1965, pp. 1723-27. The oscillator 10 contains an amplifier/limiter 12, a tuned circuit 14 electrically connected to amplifier/limiter 12, and a summer 16. Summer 16 sums a portion of an output signal $E_O$ from tuned circuit 14 with a locking signal $E_L$. The summed signal is input to amplifier/limiter 12. Amplifier/limiter 12 amplifies the summed signal forming a signal $E_g$, and injects signal $E_g$ into tuned circuit 14 to lock the frequency of output signal $E_O$ to the frequency of locking signal $E_L$.

During normal circuit operation, output signal $E_O$ is in phase with injected signal $E_g$. When the frequency of locking signal $E_L$ does not equal the frequency of output signal $E_O$, a phase shift is introduced into injected signal $E_g$ by the tuned circuit. Output signal $E_O$ therefore must follow locking signal $E_L$. The frequency of oscillation of tuned circuit 14 is locked when the frequency difference between locking signal $E_L$ and output signal $E_O$ is zero and their phase difference is constant. Locking bandwidth is proportional to the square root of the power of the injected signal $E_g$, divided by the power of the oscillator output signal $E_O$.

The present invention uses a signal generated by a direct digital synthesizer source to injection lock a local oscillator whereby amplitude and frequency type discrete spurious signal components normally present within direct digital synthesizer output are suppressed in the synthesized analog output.

Figure 3:
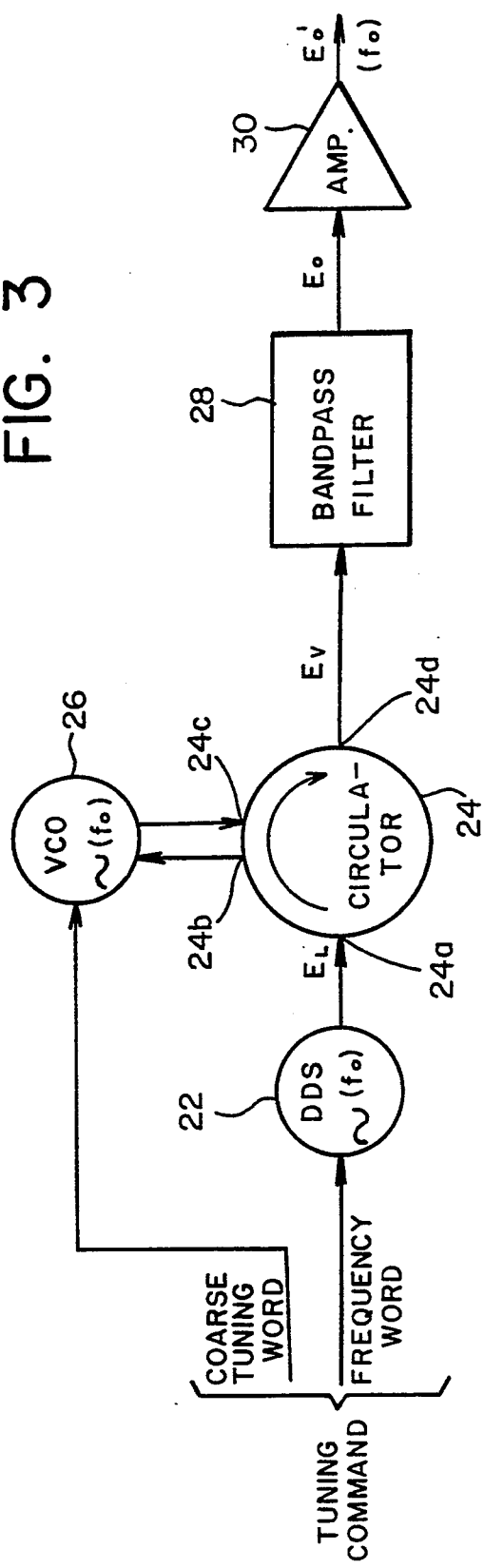
FIG. 3 is a block diagram of one embodiment of a fast tuned, injection locked, synthesized oscillator of the present invention.

One embodiment of a fast tuned, injection locked, synthesized oscillator 20 of the present invention is shown in FIG. 3. Oscillator 20 includes a direct digital synthesizer 22 for generating a digitally synthesized output signal, $E_L$, for use as a synthesized oscillator locking signal. The digitally synthesized output signal $E_L$ is electrically coupled to a first port 24a of a circulator 24. A second port 24b of circulator 24 electrically couples digitally synthesized signal $E_L$ into a voltage controlled oscillator 26. A third port 24c of circulator 24 receives an analog signal, $E_V$, generated within voltage controlled oscillator 26 and feeds it through port 24d of circulator 24 into a bandpass filter 28. Bandpass filter 28 filters the signal and passes it into an amplifier 30 where it is amplified to a level sufficient to drive a load (not shown). A directional coupler or diplexer may be used in place of circulator 24.

Operation of the fast tuned, injection locked synthesized oscillator 20 is as follows.

A tuning command in the form of a frequency word is supplied to direct digital synthesizer 22. In response, the direct digital synthesizer 22 generates the digitally synthesized output signal, locking signal $E_L$ at frequency $f_0$. Concurrently, a tuning command in the form of a coarse tuning word is supplied to voltage controlled oscillator 26. In response, voltage controlled oscillator 26 generates an analog signal $E_V$ at frequency $f_1$, if the coarse tuning word is within a locking range of frequency $f_0$.

Locking signal $E_L$ is coupled through circulator 24 to voltage controlled oscillator 26. If the frequency of locking signal $E_L$ is within the locking bandwidth of the voltage controlled oscillator, locking signal $E_L$ locks the frequency of analog signal $E_V$ at frequency $f_0$, i.e., $f_1 = f_0$. Circulator 24 couples analog signal $E_V$ into bandpass filter 28. Bandpass filter 28 filters harmonics, side bands, etc. from analog signal $E_V$ and outputs a filtered signal. Amplifier 30 amplifies the filtered signal and thus provides a filtered, amplified output signal, $E_O$, to the load.

Fabrication of a synthesized output signal in this manner is advantageous over a direct digitally synthesized signal because of the reduction of spurious frequency components in the synthesized output signal which are normally present in the direct digitally synthesized signal.

FIG. 5A shows an output spectrum of a digitally synthesized signal $E_L$ generated within direct digital synthesizer 22 of the present invention as depicted in FIG. 3. FIG. 5A illustrates a typical range level of the digitally synthesized signal free from spurious signal components. The spurious free range is seen to be approximately $-40$ dBc. The digitally synthesized signal shown is at 0 dBm (1 mw) at a fundamental frequency $f_0$.

FIG. 5B shows an output spectrum of an analog signal $E_V$ generated within voltage controlled oscillator 26 of the present invention as depicted in FIG. 3. FIG. 5B illustrates a typical range level where the output signal is free from spurious signal components. That range is about $-65$ dBc. The output power of analog signal $E_V$ as shown is 10 dBm (10 mw) at fundamental frequency $f_0$.

FIG. 5C shows an analog output signal $E_O$ generated within a synthesized oscillator of the present invention wherein an analog signal $E_V$ generated by voltage controlled oscillator 26 (FIG. 3) is locked by locking signal $E_L$ at a locking gain of 10 dB. Locking gain is the ratio of the power output by voltage controlled oscillator 26 to the power of the signal output from direct digital synthesizer 22 (LOCKING GAIN=$P_{VCO}/P_{DDS}$). Locking bandwidth is $[\Delta f_0]=(f_0/Q_{EXT})(P_{DDS}/P_{VCO})^{\frac{1}{2}}$, where $f_0$ is the fundamental frequency, $Q_{EXT}$ is the quality factor of voltage controlled oscillator 26 and $(P_{DDS}/P_{VCO})^{\frac{1}{2}}$ is the square root of the inverted locking gain.

As can be seen in FIG. 5C, spurious frequency components existing within locking signal $E_L$ at the locking bandwidth of the voltage controlled oscillator 26 are transferred to analog signal $E_V$. Outside the locking bandwidth, the spurious signal level is that of the free running voltage controlled oscillator 26, i.e., −65 dBc. However, the spurious signal free range is improved from −40 dBc to −50 dBc within the locking bandwidth as compared to locking signal $E_L$. The signal level shown displays an increase of 10 dB to +10 dBm. The contribution of spurious signal components generated by voltage controlled oscillator 26 is negligible since they are 25 dB below the spurious signal level of digital synthesizer 22.

FIG. 5D is a spectrum analysis plot of the effect on synthesized oscillator output signal $E_O$ by a 10 dB decrease in the power of locking signal $E_L$. That is, 10 dB of attenuation is added to locking signal $E_L$. Both locking signal $E_L$ and the level of spurious components contained therein are shown decreased by 10 dB. Analog signal $E_V$ that is output from voltage controlled oscillator 26, remains locked at 10 dBm even with the decrease. The 10 dB decrease in spurious signal level components of locking signal $E_L$ is manifested by a 10 dB increase in spurious signal free dynamic range in oscillator output $E_O$, i.e., to −60 dBc. Injection locking, therefore, may provide an improvement by 20 dB, i.e., from −40 to −60 dBc, of spurious signal component free range. The tradeoff for the increase, however, lies with a decrease in locking bandwidth, which is proportional to the inverse of the square root of the locking gain.

Figure 4:
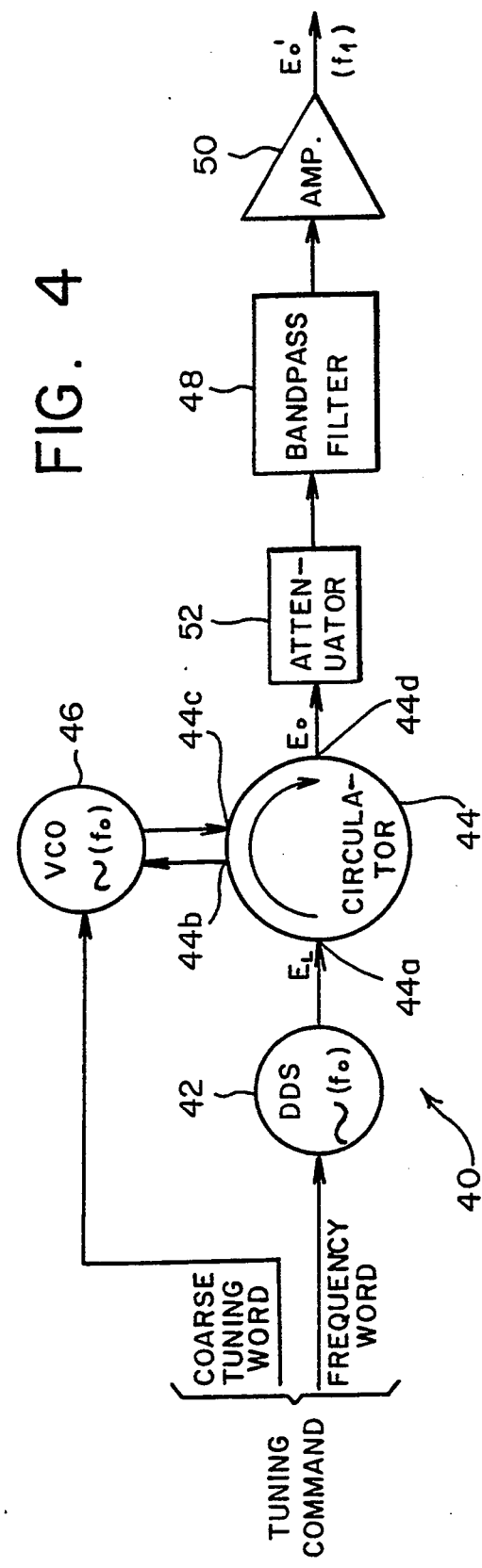
FIG. 4 is a block diagram of another embodiment of the fast tuned, injection locked oscillator of the present invention.

Another embodiment of the fast tuned, injection locked, synthesized oscillator of the present invention is shown in FIG. 4.

Synthesized oscillator 40 includes a direct digital synthesizer 42 which generates a digitally synthesized locking signal, $E_L$, at fundamental frequency $f_0$. Locking signal $E_L$ is electrically coupled to a first port 44a of a circulator 44. A second port 44b of circulator 44 electrically couples locking signal $E_L$ into a voltage controlled oscillator 46. A signal generated within voltage controlled oscillator 46, analog signal $E_V$ at frequency $f_1$, is provided to a third port 44c of circulator 44. A fourth port 44d of circulator 44 directs analog signal $E_V$ to an attenuator 52. Attenuator 52 electrically couples analog signal $E_V$ to a bandpass filter 48, thereby isolating the filter 48 from voltage controlled oscillator 46. The output signal from filter 48 is electrically coupled to an amplifier 50 for driving a load (not shown).

Operation of the present embodiment is as follows. A tuning command in the form of a frequency word and a coarse tuning word is provided to direct digital synthesizer 42 and voltage controlled oscillator 46, respectively. In response, direct digital synthesizer 42 generates a locking signal $E_L$ at frequency $f_0$. Locking signal $E_L$ is coupled through circulator 44 into voltage controlled oscillator 46. If the frequency of locking signal $E_L$ is within the locking bandwidth of voltage controlled oscillator 46, the frequency $f_1$ of analog signal $E_V$ is locked to the frequency of locking signal $E_L$, i.e., $f_1 = f_0$.

The present embodiment differs from the embodiment depicted in FIG. 3 and described above in that harmonics of analog signal $E_V$ may be selected for output by bandpass filter 48, thereby upconverting the frequency of locking signal $E_L$ as seen at the synthesized oscillator 40 output. Attenuator 52 is included to electrically isolate the voltage controlled oscillator 46 from bandpass filter 48. The isolation provided by attenuator 52 prevents the loading down of voltage controlled oscillator 46 if filter 48 removes the fundamental frequency component of analog signal $E_V$. Amplifier 50 defines the power level of synthesized output signal, $E_O$.

Figure 6:
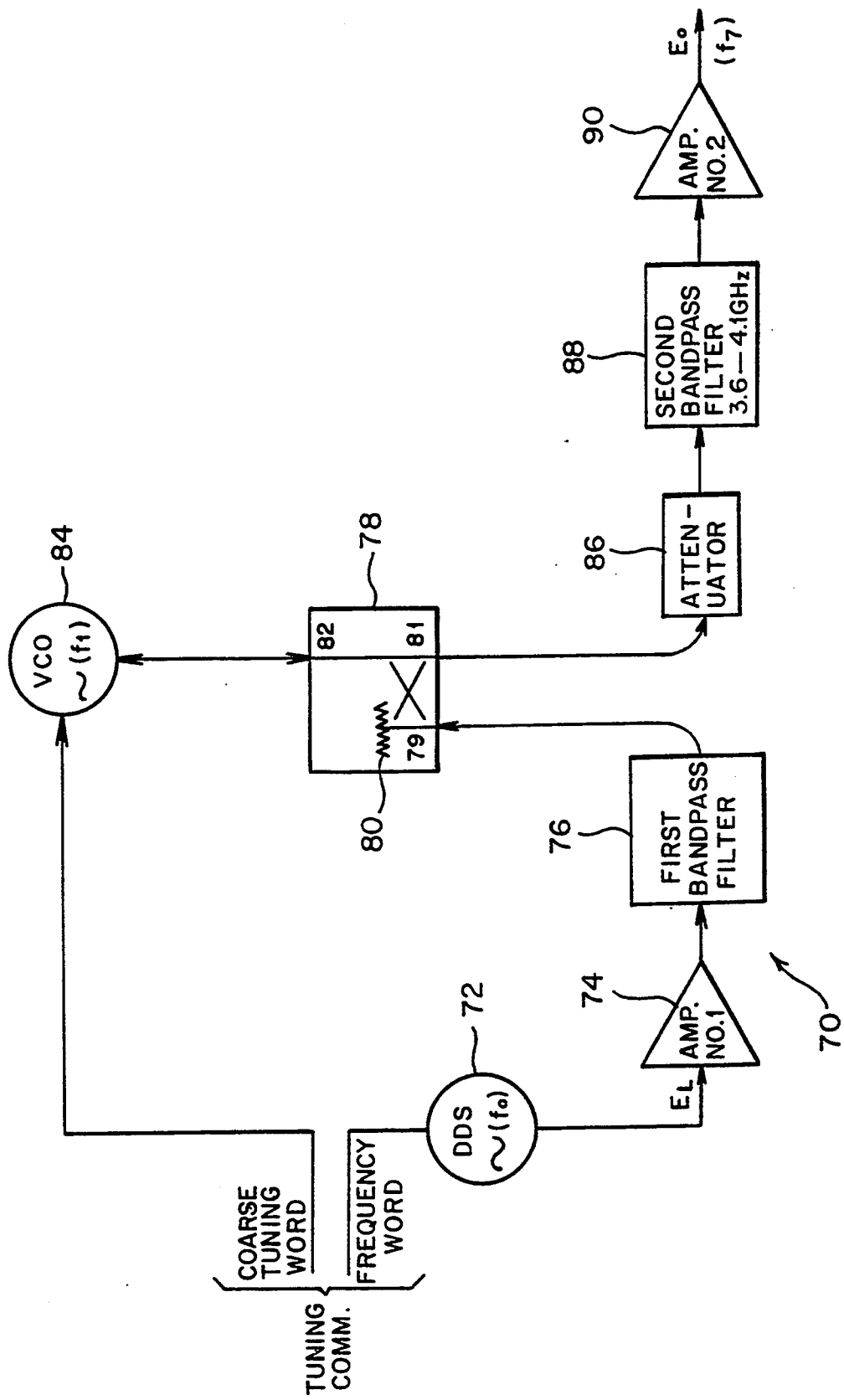
FIG. 6 is a block diagram of yet another embodiment of the fast tuned, injection locked synthesized oscillator of the present invention.

FIG. 6 shows yet another embodiment of the fast tuned, injection locked, synthesized oscillator of the present invention.

A synthesized oscillator 70, operable within the 3.6 to 4.1 gigahertz (GHz) range includes a direct digital synthesizer 72, shown electrically coupled to a first amplifier 74. Direct digital synthesizer 72 generates a locking signal, $E_L$, at a frequency $f_0$ within a range of about 450 to 512.5 megahertz (MHz). First amplifier 74 electrically connects direct digital synthesizer 72 to a first bandpass filter 76, and amplifies signal $E_L$. First bandpass filter 76 is electrically connected to a port 79 of a coupler 78. First bandpass filter 76 removes unwanted harmonics and extraneous signal components from locking signal $E_L$.

A port 82 of coupler 78 is electrically coupled to voltage-controlled oscillator 84. Voltage controlled oscillator 84 generates an analog signal, designated $E_V$ at frequency $f_1$. The free running frequency range of voltage controlled oscillator 84 is preferably about 1.8 to about 2.05 GHz. Voltage controlled oscillator 84 is electrically connected through port 81 of directional coupler 78 to an attenuator 86. Attenuator 86 is electrically connected to a second bandpass filter 88. Attenuator 86 electrically isolates voltage controlled oscillator 84 from second bandpass filter 88. Second bandpass filter 88, with a passband of about 3.6 to about 4.1 GHz, removes all frequency components of analog signal $E_V$ outside that passband. Second bandpass filter 88 is electrically coupled to a second amplifier 90. The signal output from second amplifier 90 is directed to a load (not shown).

Directional coupler 78 is used in this embodiment in lieu of a conventional circulator. Coupler 78 is used because a circulator bandwidth does not include the full 8 to 1 frequency range between locking signal $E_L$, (i.e., 450 to 512.5 MHz) and the synthesized oscillator output signal $E_O$ (i.e., 3.6 to 4.1 GHz).

Locking signal $E_L$ of the present embodiment is generated by direct digital synthesizer 72 at a frequency below the above-mentioned 450–512.5 MHz range and up-converted. Frequency up-conversion is required because commercially available direct digital synthesizer technology is incapable of providing an output in the stated frequency range. However, near future projected technology is expected to provide digitally synthesized signal output at about 450 to 512.5 MHz. Signals of up to 450 MHz have already been demonstrated, as disclosed by G. Edwards in the article, "GaAs NCO operates up to 1.4 GHz" RF Design, June, 1990, pp. 42–51.

Operation of fast tuned, injection locked synthesized oscillator 70 is as follows.

A tuning command in the form of a frequency word and a coarse tuning word is supplied to direct digital synthesizer 72 and voltage controlled oscillator 84, respectively. In response, direct digital synthesizer 72 generates locking signal $E_L$ at fundamental frequency $f_0$ within the range of 450–512.5 MHz. Voltage controlled oscillator 84 responds to the coarse tuning word by generating analog signal $E_V$, at a fundamental frequency $f_1$ within the approximate range of 1.8–2.05 GHz.

Locking signal $E_L$ is fed into first amplifier 74. The bandwidth of first amplifier 74 is such that the frequency $f_0$ of locking signal $E_L$, 450 to 512.5 MHz, is below and out-of-band with it. Locking signal $E_L$ is therefore amplified within the skirt or non-linear region of the amplifier bandwidth. The result is a lower gain for locking signal $E_L$ (450 to 512.5 MHz) than would result with a higher frequency signal. Accordingly, the locking signal $E_L$ compresses faster within the amplifier, generating harmonics of the fundamental frequency therefrom.

First bandpass filter 76 receives the amplified locking signal $E_L$ (including harmonics) from first amplifier 74. First bandpass filter 76 removes substantially all frequency components, i.e., harmonics, from signal $E_L$ other than those equal to the fundamental frequency of the voltage controlled oscillator 84 (1.8 to 2.05 GHz). The passband of first bandpass filter 76 may be designed to pass any harmonic N of the amplified locking signal $E_L$ where N is an integer preferably within a range of from about 1 to about 10. The frequency of locking signal $E_L$ is four times the fundamental frequency of the direct digital synthesizer 72, enabling direct digital synthesizer 72 to provide a locking signal $E_L$ beyond its normal operating range. Further, filtered locking signal $E_L$ arrives substantially spectrally pure at directional coupler 78.

Analog signal $E_V$ is locked in frequency by locking signal. $E_L$, i.e., $f_1 = Nf_0$, if the frequency of the filtered locking signal $E_L$ is within the locking bandwidth of the voltage controlled oscillator 84, i.e., 1.8 to 2.05 GHz. Attenuator 86 receives analog signal $E_V$ locked at 1.8 to 2.05 GHz via coupler 78 and passes it into second bandpass filter 88. Second bandpass filter 88 filters analog signal $E_V$, removing substantially all frequency components other than those of the second harmonic, i.e., 3.6 to 4.1 GHz. The filtered signal is then amplified within second amplifier 90 to a level appropriate for driving a load (not shown).

A circulator rather than a directional coupler may be used with the present embodiment to couple locking signal $E_L$ to voltage controlled oscillator 84. This is because the frequency of locking signal $E_L$ output from first bandpass filter 76 equals the fundamental frequency of analog signal $E_V$ generated within voltage controlled oscillator 84. Because the frequencies of those signals are the same, i.e., analog signal $E_V$ and locking signal $E_L$, a circulator may be used. Using a circulator in lieu of a coupler eliminates a 10 dB loss of power from locking signal $E_L$ within the coupler arm, i.e., termination 80 of coupler 78. A circulator also ensures smooth and continuous voltage tuning without the need for an attenuator between the first bandpass filter 76 and the circulator due to the inherent isolation provided by the circulator.

The in situ generated second harmonic of voltage controlled oscillator 84 is the desired output of the present embodiment, i.e., 3.6 to 4.1 GHz. The overall frequency multiplication of locking signal $E_L$ reflected in the frequency of the synthesized output signal is eight. This up-conversion provides for intrinsic isolation between the tuning circuit (not shown) within voltage controlled oscillator 84 and the load. The isolation provides for a diminished pulling factor, thereby minimizing distortion. The synthesized oscillator 70 thereby provides a precisely tuned synthesized output signal $E_O$ at the fast tuning speeds of a direct digital synthesizer with minimal spurious signal components associated therewith.

Conventional subharmonic injection locking techniques provide a typical locking signal bandwidth of approximately ±6 MHz. A 6 MHz locking bandwidth generally occurs with a locking gain of approximately 4.5 dB. The ±6 MHz bandwidth obtained by conventional locking techniques is for the most part too narrow to ensure reliable locking at higher frequencies due to frequency drift within locked signal sources (e.g., voltage controlled oscillator). A detailed analysis of prior art injection locking techniques can be found in an article by Zhang, et al. entitled "A study Of Subharmonic Injection Locking for Locking Oscillators", IEEE Microwave And Guided Wave Letters, vol. 2, No. 3, pp. 97–99 (March, 1992). The method of subharmonic injection locking disclosed by the present invention enables locking at a much wider bandwidth.

The above-described synthesized oscillator 70 was breadboarded and tested. A direct digital synthesizer is an ADS-232 manufactured by Sciteq Electronics, Inc. of San Diego, Calif. The direct digital synthesizer used was a low frequency unit that was frequency translated with a mixer to the 450 to 512.5 MHz range. The voltage controlled oscillator 84 used was a silicon bipolar transistor oscillator of the VTO-9000 series manufactured by Avantek Inc., of Milpitas, Calif. First and second bandpass filters 76 and 78 were manufactured by Microphase Corporation of Norwalk, Conn.

The locking bandwidth for a synthesized output within a frequency range of 1.8–2.05 GHz was increased in the breadboarded model to ±30 MHz. This is a fivefold increase over locking bandwidth available for a synthesized oscillator within that frequency range of the existing art. Locking gain was realized at 4.5 dB thereby ensuring reliable locking. The performance characteristics of that circuit are as follows.

Figure 7:
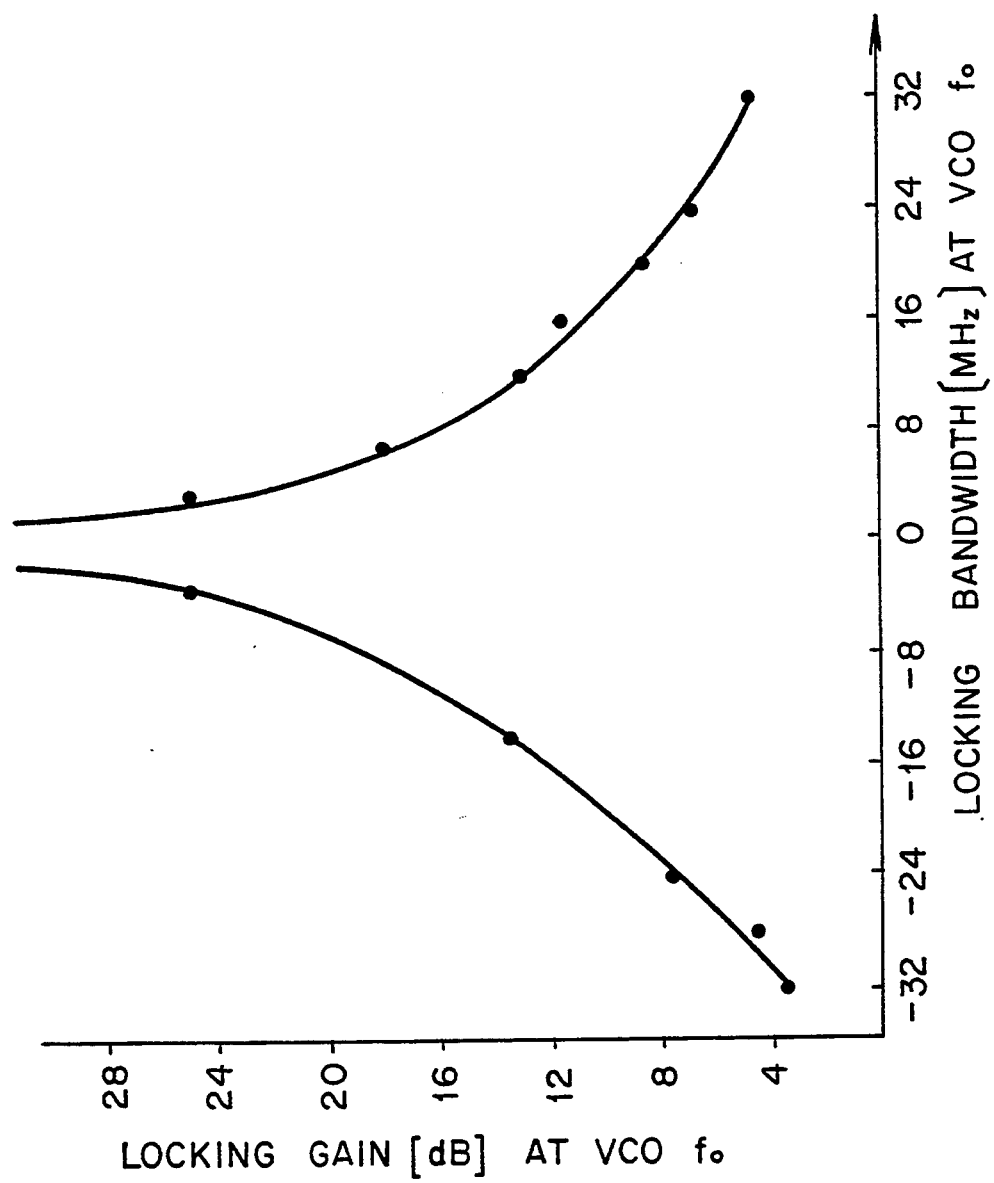
FIG. 7 is a plot of locking gain versus locking bandwidth for a voltage controlled oscillator used within the present invention operating at a fundamental frequency of 2.05 GHz.

A plot of locking gain versus locking bandwidth of voltage controlled oscillator 84 ($f_0 = 2.05$ GHz) is shown in FIG. 7. Voltage controlled oscillator 84 was injection locked with locking signal $E_L$ operating at the fourth harmonic (2.05 GHz, $f_0 = 512.5$ MHz) of the signal generated within direct digital synthesizer 72. The analog signal $E_V$ output from synthesized oscillator 70 was obtained at 4.1 GHz, which is the in situ generated second harmonic of voltage controlled oscillator 84. The 4 dB locking gain displayed corresponded to a ±60 MHz locking bandwidth at 4.1 GHz in the 3.6 to 4.1 GHz output frequency range.

Figure 8:
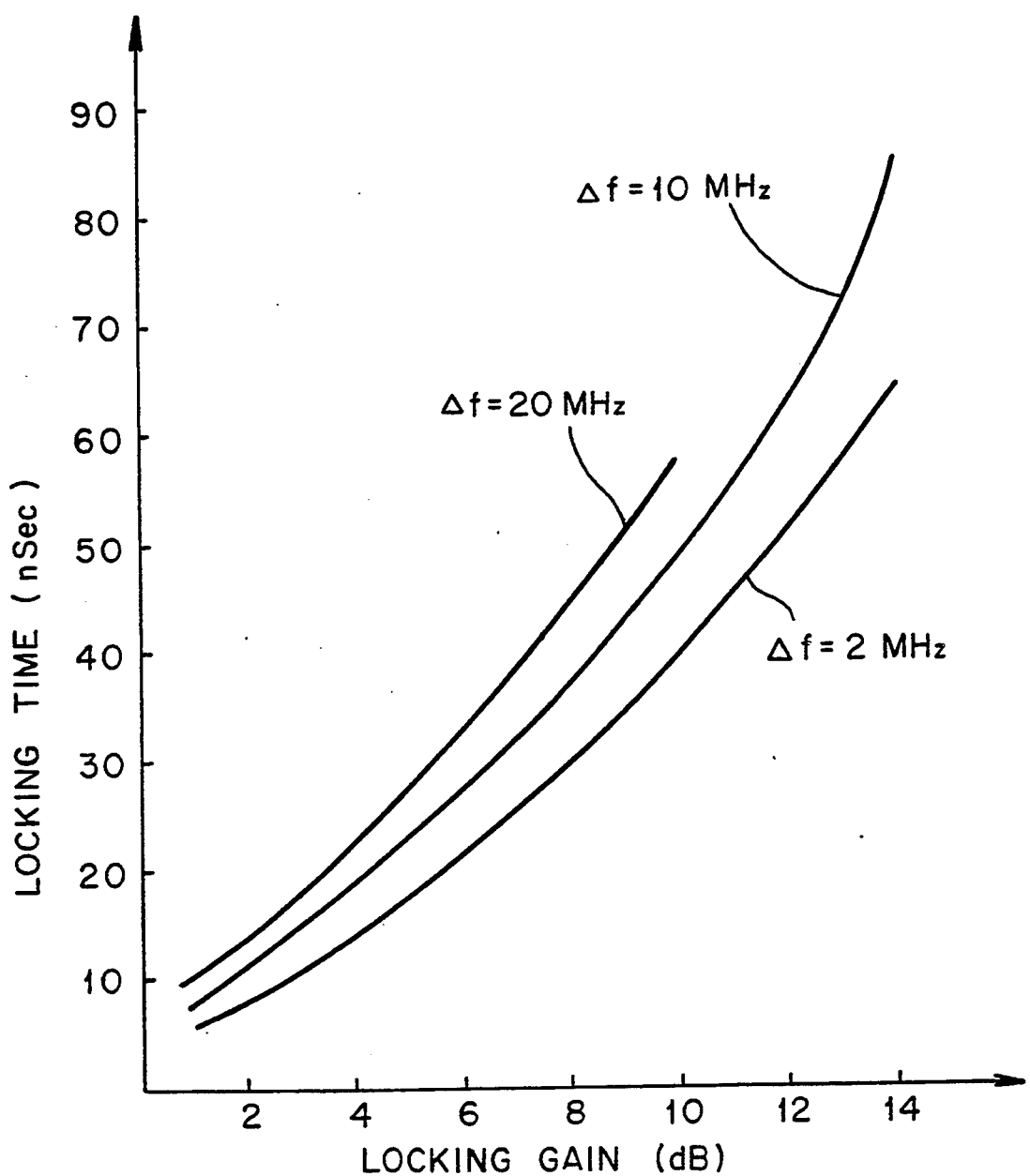
FIG. 8 is a plot of calculated locking time versus locking gain for a voltage controlled oscillator used within the present invention.

A plot of calculated locking time as a function of locking bandwidth of the breadboarded oscillator constructed in accordance with the present invention is shown in FIG. 8. The calculations depicted therein were based on voltage controlled oscillator 84 operating at a fundamental frequency of 2 GHz (4 GHz synthesized oscillator output frequency). The quality factor $Q_{ext}$ for the voltage controlled oscillator was approximately 35. Locking bandwidth Δf is the initial frequency difference between locking signal $E_L$ input to voltage controlled oscillator 84 and its analog signal $E_V$. Locking time decreased with decreasing locking gain, decreasing locking bandwidth Δf and decreasing quality factor $Q_{ext}$. The coarse tuning word directed to voltage controlled oscillator 84 is intended to be within ±2 MHz of its fundamental frequency.

Figure 9:
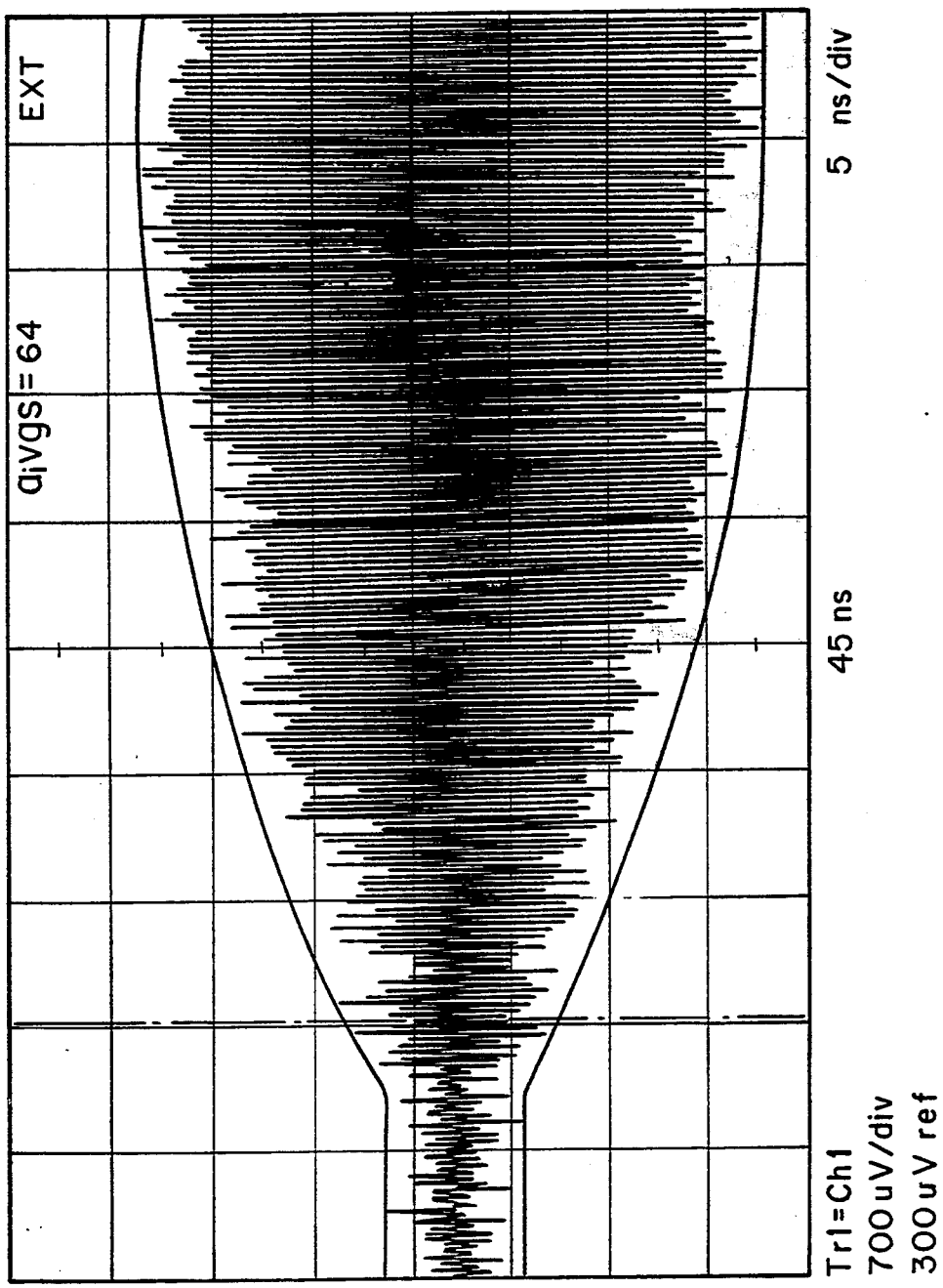
FIG. 9 is a graph of voltage versus time depicting the locking time for a synthesized oscillator of the present invention.

A time-domain locking time measurement is shown in FIG. 9. The measurement was taken using an HP 71500A Microwave Transition Analyzer manufactured by Hewlett-Packard of Palo Alto, Calif. The figure shows the sample-based output signal from the transition analyzer for a synthesized output signal $E_O$ at 4 GHz, i.e., the second harmonic of the signal generated within voltage controlled oscillator 84.

Locking time was found to be approximately 40 nanoseconds with a locking gain of 4.5 dB. The initial (unlocked) frequency difference, ΔF, between the direct digital synthesizer 72 and the voltage controlled oscillator 84 frequencies was 10 MHz. The low amplitude region in the left portion of the display shown in FIG. 9 corresponds to the free running of voltage controlled oscillator 84. The region to the right of the display of FIG. 9 shows the voltage controlled oscillator 84 output locked by the reference source, i.e., the fourth harmonic of the generated locking signal. The measured 40 nanosecond locking time is more than an order of magnitude faster than that of a conventional oscillator employing phase locked loop technology. A more detailed description of injection locking time can be found in an article by L. J. Paciorik entitled "Injection Locking of Oscillators", PROC. IEEE, Vol. 53, No. 11, November 1965, pp. 1723–1727.

Figure 10A:
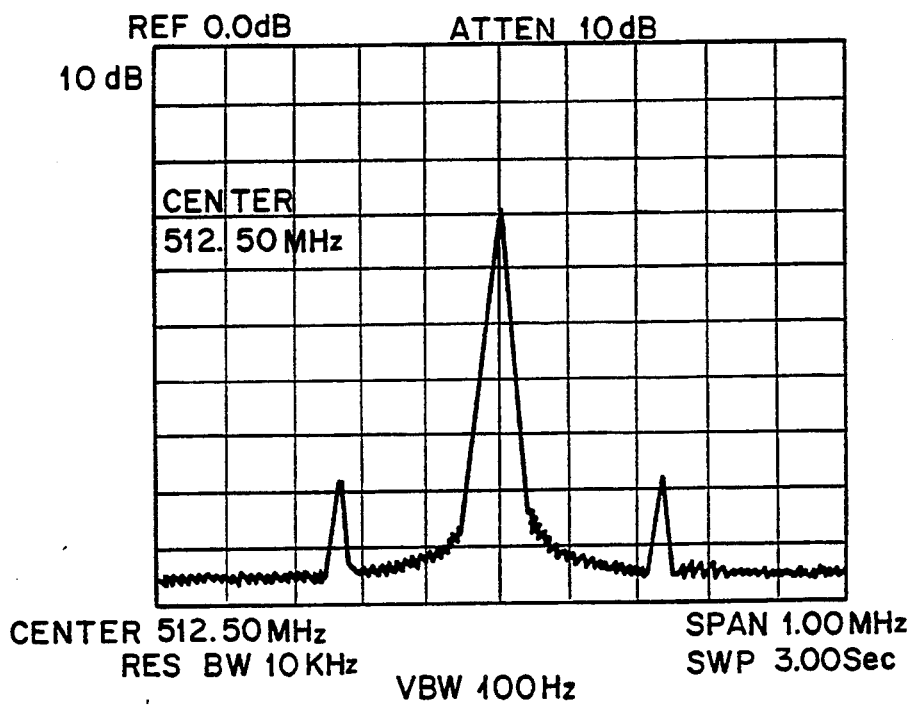
FIG. 10A is a frequency analysis plot of an amplitude modulated sinewave signal synthesized at 512.5 MHz in accordance with the present invention.
Figure 10B:
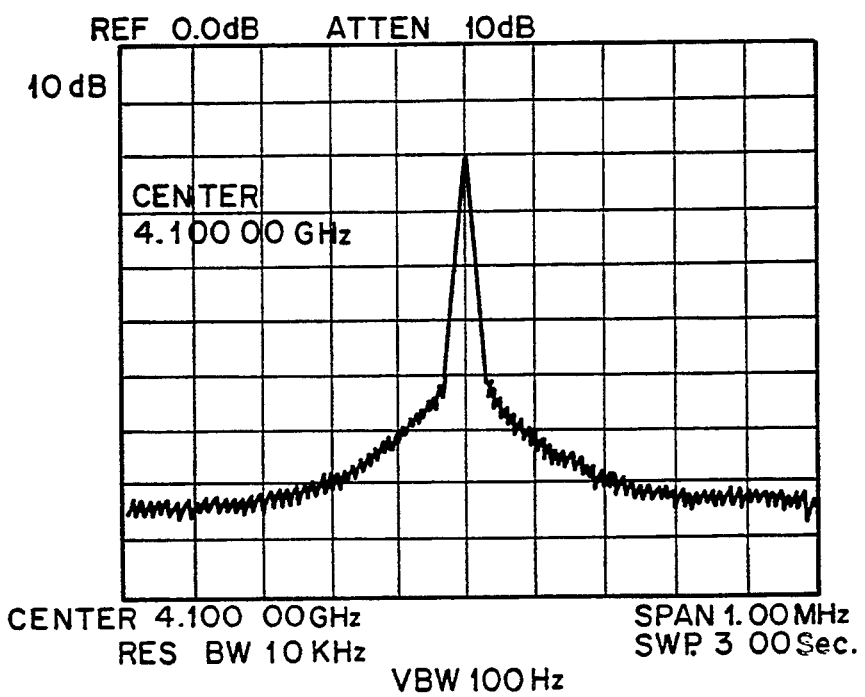
FIG. 10B is a frequency analysis plot of a signal output from an injection locked, synthesized oscillator of the present invention operating at 4.1 GHz displaying none of the amplitude spurs inherent in the locking signal shown in FIG. 10A.

The ability of the fast tuned, injection locked, synthesized oscillator 70 of the present invention to suppress amplitude modulation side bands generated by the reference source (direct digital synthesizer 72) can be seen with a comparison of FIGS. 10A and 10B. FIG. 10A shows a spectrum analysis plot of an amplitude modulated sinewave signal at 220 KHz generated by a Wiltron ™ synthesizer, model no. 6759B manufactured by Wiltron, Inc. of Morgan Hill, Calif. Amplitude spurs can be seen in the synthesized output. The spectrum analysis plot of FIG. 10B shows the output signal of the injection locked, synthesized oscillator 70 of the present invention at 4.1 GHz. The amplitude spurs are significantly suppressed by virtue of the injection locking process, which is substantially insensitive to amplitude modulation.

The ability of the fast tuned, injection locked, synthesized oscillator 70 of the present invention to suppress spurious frequency components or spurs generated by the reference source (direct digital synthesizer 72) can be seen with the comparison of FIGS. 11A, 11B, 11C and 11D.

Figure 11A:
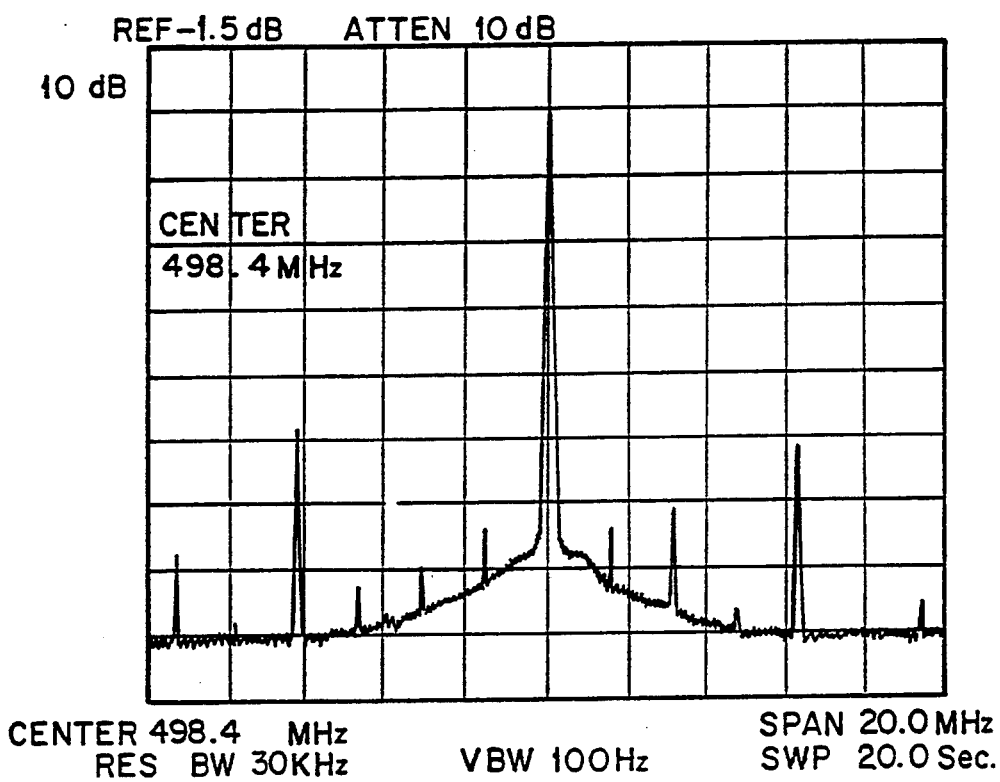
FIG. 11A is a frequency analysis plot of a locking signal output from a direct digital synthesizer of the present invention at a frequency of 498.4 MHz.

FIG. 11A shows a spectrum analysis plot of a digitally synthesized locking signal, $E_L$ operating at a frequency of 498.4 MHz. The frequency of the locking signal is within the range of 450 to 512.5 MHz, corresponding to a fourth subharmonic within a fundamental frequency range 1.8 to 2.05 GHz of voltage controlled oscillator 84. The fundamental frequency of the locked voltage controlled oscillator is 1993.75 MHz. The discreet spurious frequency components (spurs) of the direct digital synthesizer 72 are seen to be of significant magnitude and the signal to spur ratio is approximately −52 dBc.

Figure 11B:
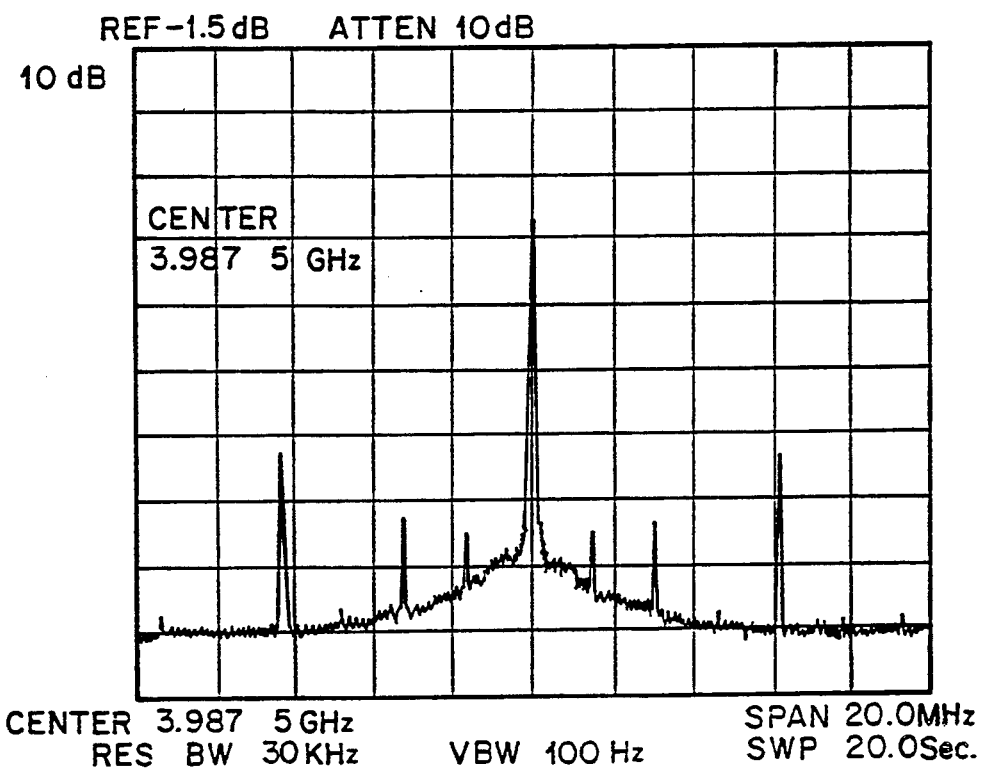
FIG. 11B is a spectrum analysis plot of a signal output from an injection locked, synthesized oscillator of the present invention in which a voltage controlled oscillator operating at a fundamental frequency of 1993.75 MHz has been subharmonically locked by the locking signal depicted in FIG. 11A.

FIG. 11B shows a spectral analysis plot of a signal output from an injection locked, synthesized oscillator 70 of the present invention. The frequency of the synthesized oscillator output signal is 3987.5 MHz, the in-situ generated second harmonic of voltage controlled oscillator 84. The voltage controlled oscillator 84 is locked to the frequency of a fourth harmonic of the signal shown in FIG. 11A, i.e., locked at frequency 1993.6 MHz. The overall frequency multiplication between the frequency of locking signal $E_L$, i.e., 498.4 MHz, and the frequency of locked analog signal $E_V$ is by a factor of 8. The spurious frequency content of locking signal $E_L$ is seen to be replicated within the locking bandwidth. The minimum spurious component free range has been degraded to 36 dBc due to the $N^2$ degradation (18 dB) incurred by the 8 times multiplication.

Figure 11C:
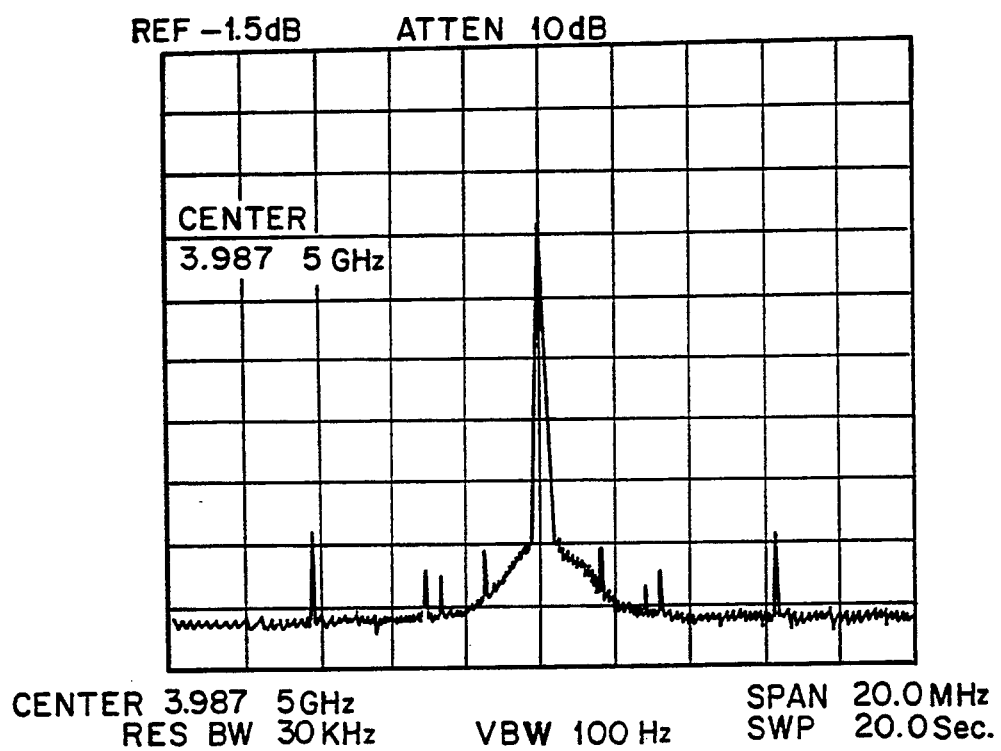
FIG. 11C is a spectrum analysis plot of a signal output from an injection locked, synthesized oscillator of the present invention displaying a 20 dB increase in locking gain relative to the locking gain displayed in the synthesized oscillator output depicted in FIG. 11B.

FIG. 11C shows a spectrum analysis plot of a signal output from the injection locked, synthesized oscillator 70 of the present invention displaying a 20 dB increase in locking gain relative to the locking gain displayed by the synthesized oscillator output signal depicted in FIG. 11B. The locking gain was increased by adding 20 dB of attenuation to the locking signal generated by direct digital synthesizer 72 and injected into voltage controlled oscillator 84. FIG. 11C shows a significant decrease in the level of phase noise close in frequency to the locked analog signal $E_V$ in the level of spurious frequency components within the locked analog signal. The minimum spurious component free range is −50 dBc, displaying a 16 dB improvement relative to the locked analog signal $E_V$ depicted in FIG. 11B. Hence, by increasing locking gain, the $N^2$ penalty (18 dB) due to the 8 times frequency multiplication has been nearly eliminated.

Figure 11D:
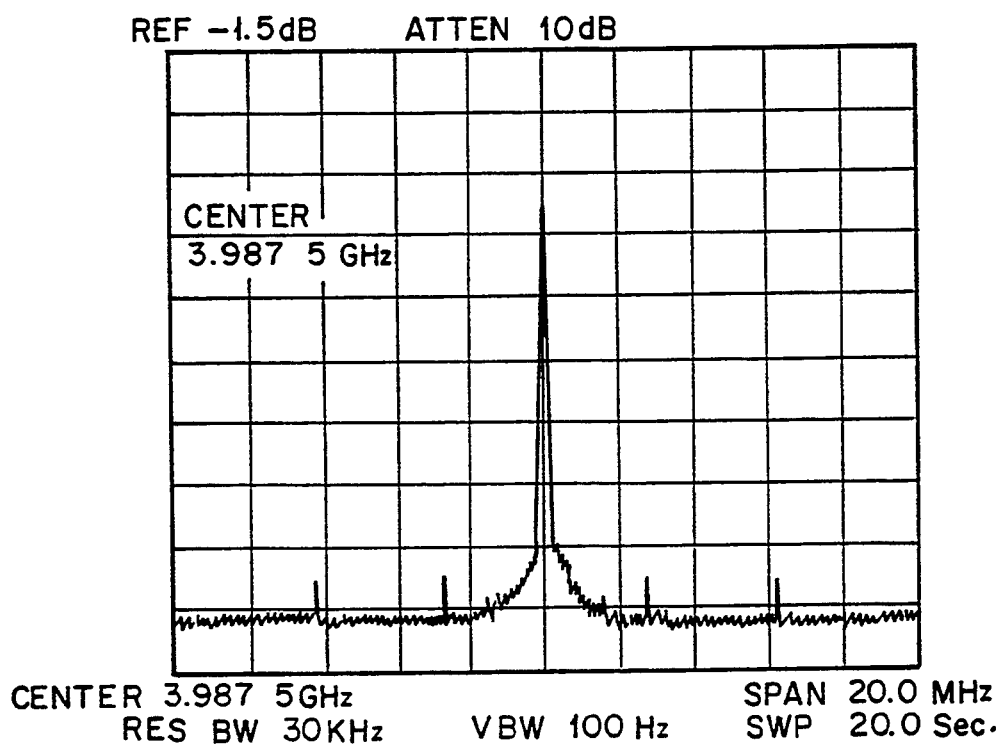
FIG. 11D is a spectrum analysis plot of a signal output from an injection locked, synthesized oscillator of the present invention displaying a 10 dB increase in the locking gain relative to the locking gain displayed in the synthesized oscillator output depicted in FIG. 11C.

FIG. 11D shows a spectral analysis plot of a signal output from the injection locked, synthesized oscillator 70 of the present invention displaying an additional 10 dB increase in locking gain relative to the locking gain displayed by the synthesized oscillator output signal depicted in FIG. 11C. The level of phase noise close in frequency to the locked analog signal $E_V$ output from voltage controlled oscillator 84 and the spurious frequency components of the locked signal have been further decreased in relation to the locked analog signal $E_V$ shown FIG. 11C. The minimum spurious signal component free range is −58 dBc. This is 6 dB better than the spurious frequency component level of the direct digital synthesizer output depicted in FIG. 11A.

Therefore, controlling the locking gain within the injection locked, synthesized oscillator 70 of the present invention not only eliminates the $N^2$ degradation due to spurious frequency components present within the spectrum of locking signal $E_L$, but actually improves the spurious component free range of locked analog signal $E_V$ by 6 dB. The stability characteristics of the direct digital synthesizer are maintained in the output of voltage controlled oscillator 84, although they are maintained over a smaller locking bandwidth. This is evidenced in FIGS. 11B, 11C and 11D, where the output frequency and power are shown to have remained constant. The spurious component free level of the free running voltage controlled oscillator 84 is rated to be less than −60 dBc and prevails outside the locking bandwidth.

Figure 12:
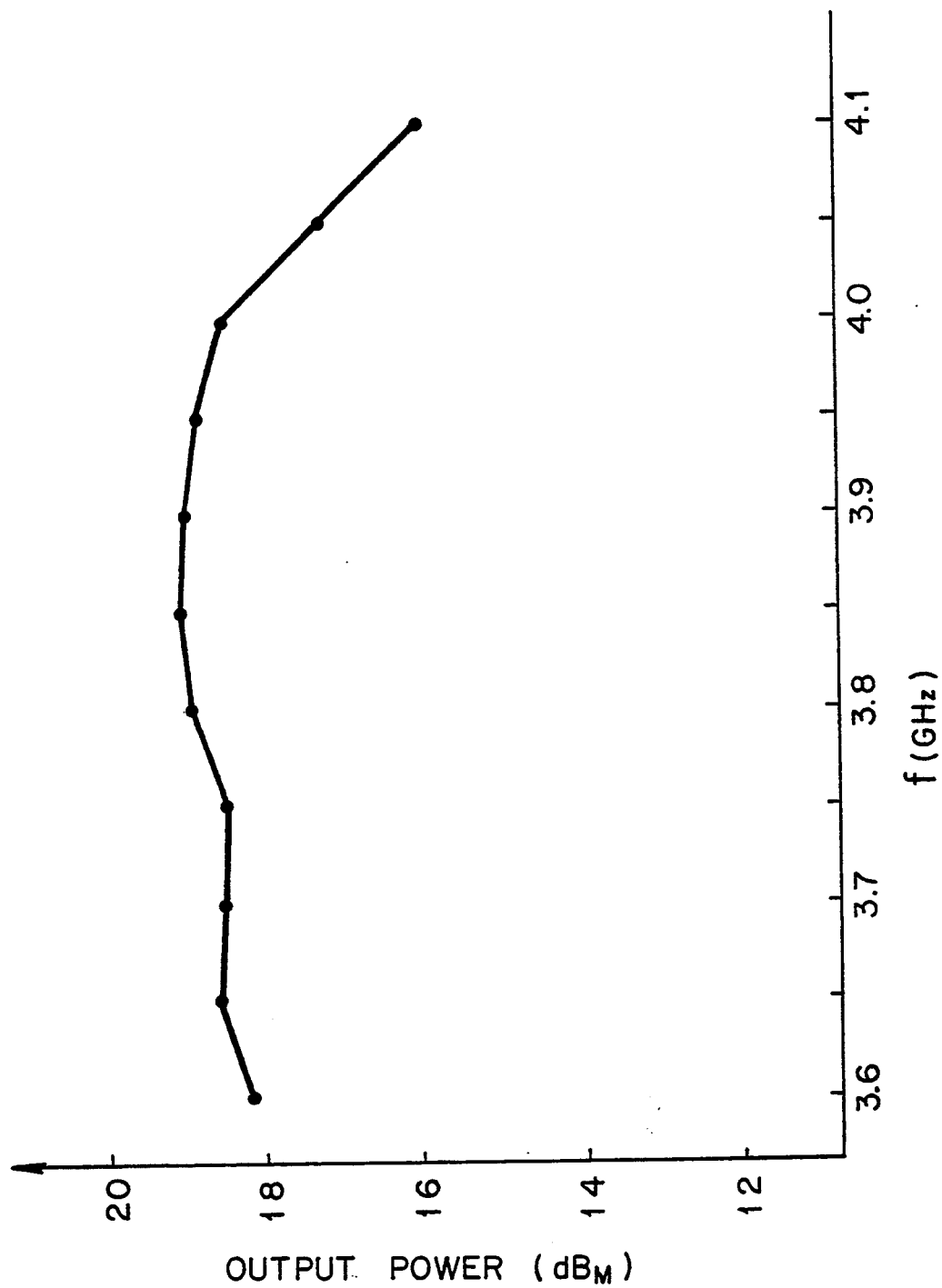
FIG. 12 is a plot of synthesized oscillator output power versus frequency in the GHz range of the output signal from an oscillator formed in accordance with the present invention.

A spectrum analysis plot of synthesized oscillator 70 output power versus frequency is shown in FIG. 12. The output power over the desired 3.6 to 4.1 GHz tunable range is shown to be +17.5 ±1.5 dBm. The spurious component level within the output spectrum is less than 60 dBc out to at least 18 GHz. The spurious signal component level of the voltage controlled oscillator 84 output is a minimum of −60 dBc outside the range of the locking bandwidth of ±60 MHz. Inside the locking bandwidth, the spurious component content is that of the reference source diminished by the suppression provided by the injection locking arrangement.

As can be seen from the above description, the fast tuned, injection locked, synthesized oscillator of the present invention is capable of up-converting and broadening the frequency range of a fast-tuned, digital reference source. The synthesized oscillator suppresses amplitude and frequency modulated spurious components associated with the source. The locking bandwidth of conventional subharmonic injection oscillators is increased by 5 with the present invention. Also, locking times in the 40 nsec. range for the present invention are an order of magnitude lower than locking times for conventional phase locked oscillators.

Although illustrative embodiments of the present invention have been described herein with reference to the accompanying drawings, is to be understood that the invention is not limited to those precise embodiments, and that various other changes and modifications may be effected therein by one skilled in the art without departing from the scope or spirit of the invention.

What is claimed is:

1. A method of tuning an analog oscillator to cause the analog oscillator to generate an oscillator output signal substantially free from spectral impurities, the analog oscillator including a direct digital synthesizer and an analog oscillator circuit, the method comprising the steps of:

tuning the analog oscillator circuit to cause the analog oscillator circuit to generate an analog signal at a frequency $f_1$, the analog oscillator circuit having a predetermined locking bandwidth over which the analog oscillator circuit can be injection locked to a desired frequency within the locking bandwidth;

tuning the direct digital synthesizer to cause the direct digital synthesizer to generate a digitally synthesized signal at a frequency $f_0$, the frequency $f_0$ being within the locking bandwidth of the analog oscillator circuit; and injection locking the frequency of the analog signal to the frequency of the digitally synthesized signal, the analog oscillator circuit being responsive to the digitally synthesized signal so that the frequency $f_1$ of the analog signal equals N times the frequency $f_0$ of the digitally synthesized signal, where N is an integer greater than 0, the analog oscillator being responsive to the analog signal injection locked at the frequency $f_0$ so that the oscillator output signal corresponds in frequency to the analog signal.

2. A method as defined by claim 1, including the steps of:

filtering the analog signal to provide a filtered signal substantially equal in frequency to N times the frequency $f_0$, where N is a positive non-zero integer; and amplifying the filtered signal to a level sufficient to drive a load thereby providing the oscillator output signal.

3. A method as defined by claim 2, wherein the step of filtering further includes the step of removing substantially all frequency components from the locked analog signal other than those equal to $Nf_0$, where N is an integer within the range of about 1 to about 10.

4. A method of tuning an analog oscillator to cause the analog oscillator to generate a frequency up-converted oscillator output signal substantially free from spectral impurities, the analog oscillator including a direct digital synthesizer and an analog oscillator circuit, the method comprising the steps of:

tuning the analog oscillator circuit to cause the analog oscillator circuit to generate an analog signal at a frequency $f_1$, the analog oscillator circuit having a predetermined locking bandwidth over which the analog oscillator circuit can be injection locked to a desired frequency within the locking bandwidth;

tuning the direct digital synthesizer to cause the direct digital synthesizer to generate a digitally synthesized signal at a frequency $f_0$;

generating a harmonic signal which is at a harmonic frequency of the digitally synthesized signal, the frequency of the harmonic signal being within the locking bandwidth of the analog oscillator circuit; and injection locking the frequency of the analog signal to the frequency of the harmonic signal, the analog oscillator circuit being responsive to the harmonic signal so that the frequency $f_1$ of the analog signal equals N times the frequency $f_0$ of the harmonic signal, where N is a positive non-zero integer, the analog oscillator being responsive to the analog signal injection locked at the frequency of the harmonic signal so that the oscillator output signal corresponds in frequency to the analog signal.

5. A method as defined by claim 4, wherein the step of generating the harmonic signal includes:

amplifying the digitally synthesized signal to generate an amplified signal that contains at least one harmonic of the frequency $f_0$ of the digitally synthesized signal; and filtering the amplified signal to provide the harmonic signal at a frequency equal to K times the frequency $f_0$ of the digitally synthesized signal, where K is a positive non-zero integer.

6. A method as defined by claim 5, including the step of filtering the analog signal to remove substantially all frequency components therefrom other than a frequency component having a frequency $Lf_1$, where L is a positive non-zero integer.

7. A method as defined by claim 5, further including the step of amplifying the analog signal to a level sufficient to drive a load.

8. A direct digital synthesizer-based, injection locked oscillator for generating an oscillator output signal that is substantially free from spectral impurities, comprising:

an analog oscillator circuit for generating an analog signal at a frequency $f_1$, the analog oscillator circuit having a predetermined locking bandwidth over which the analog oscillator circuit can be injection locked to a desired frequency within the locking bandwidth; and a direct digital synthesizer for generating a digitally synthesized signal at a frequency $f_0$, the frequency $f_0$ being within the locking bandwidth of the analog oscillator circuit, the analog oscillator circuit being injection locked to the digitally synthesized signal so that the frequency $f_1$ of the analog signal equals N times the frequency $f_0$ of the digitally synthesized signal, where N is a positive non-zero integer, the analog oscillator being responsive to the analog signal injection locked at frequency $f_0$ so that the oscillator output signal corresponds in frequency to the analog signal.

9. A direct digital synthesizer-based, injection locked oscillator as defined by claim 8, which further includes a filter, the filter being responsive to the analog signal and providing a filtered analog signal in response thereto.

10. A direct digital synthesizer-based, injection locked oscillator as defined by claim 9, further including an amplifier, the amplifier being responsive to the filtered analog signal and providing an amplified signal in response thereto.

11. A direct digital synthesizer-based, injection locked oscillator as defined by claim 9, wherein the filter includes means for removing substantially all frequency components from the analog signal other than one harmonic frequency component such that the resulting filtered analog signal is generated at a frequency $Nf_1$, where N is a positive non-zero integer.

12. A direct digital synthesizer-based, injection locked oscillator as defined by claim 8, further including isolation means for preventing the loading down of the analog oscillator circuit, the isolation means being responsive to the analog signal and providing an isolated analog signal in response thereto.

13. A direct digital synthesizer-based, injection locked oscillator as defined by claim 8, which further includes means responsive to the digitally synthesized signal for providing the digitally synthesized signal to the analog oscillator circuit.

14. A direct digital synthesizer-based, injection locked oscillator as defined by claim 13, wherein the means for providing the digitally synthesized signal to the analog oscillator circuit includes a circulator.

15. A direct digital synthesizer-based, injection locked oscillator for generating an oscillator output signal that is substantially free from spectral impurities, comprising:
an analog oscillator circuit for generating an analog signal at a frequency $f_1$, the analog oscillator circuit having a predetermined locking bandwidth over which the analog oscillator circuit can be injection locked to a desired frequency within the locking bandwidth;
a direct digital synthesizer for generating a digitally synthesized signal at a frequency $f_0$; and
means for generating a harmonic signal which is at a harmonic frequency of the digitally synthesized signal, the frequency of the harmonic signal being within the locking bandwidth of the analog oscillator circuit;
wherein the frequency of the analog signal is injection locked to the frequency of the harmonic signal, the analog oscillator circuit being injection locked to the harmonic signal so that the frequency $f_1$ of the analog signal equals N times the frequency $f_0$ of the harmonic signal, where N is a positive non-zero integer, the analog oscillator being responsive to the analog signal injection locked at the frequency of the harmonic signal so that the oscillator output signal corresponds in frequency to the analog signal.

16. A direct digital synthesizer-based, injection locked oscillator as defined by claim 15, which further comprises an amplifier, the amplifier being responsive to the analog signal and amplifying the analog signal to a level sufficient to drive a load.

17. A direct digital synthesizer-based, injection locked oscillator as defined by claim 15, which further comprises a filter, the filter being responsive to the analog signal and removing substantially all frequency components from the analog signal other than a frequency component having a frequency $Mf_1$, where M is a positive non-zero integer.

18. A direct digital synthesizer-based, injection locked oscillator as defined by claim 15, which further comprises isolation means for preventing the loading down of the analog oscillator circuit, the isolation means being responsive to the analog signal and providing an isolated analog signal in response thereto.

19. A direct digital synthesizer-based, injection locked oscillator as defined by claim 18, wherein the isolation means includes an attenuator.

20. A direct digital synthesizer-based, injection locked oscillator as defined by claim 15, which further comprises means responsive to the harmonic signal for providing the harmonic signal to the analog oscillator circuit.

21. A direct digital synthesizer-based, injection locked oscillator as defined by claim 20, wherein the means for providing the harmonic signal to the analog oscillator circuit includes a circulator.

22. A direct digital synthesizer-based, injection locked oscillator as defined by claim 15, wherein the harmonic signal generating means includes an amplifier and a filter, the amplifier being responsive to the digitally synthesized signal and generating in response thereto an output signal which contains at least one harmonic of the frequency $f_0$ of the digitally synthesized signal, the filter being responsive to the output signal of the amplifier and providing in response thereto the harmonic signal at a frequency equal to K times the frequency $f_0$ of the digitally synthesized signal, where K is a positive non-zero integer.

* * * * *